United States Patent
Price et al.

(10) Patent No.: US 10,484,623 B2
(45) Date of Patent: Nov. 19, 2019

(54) SENSOR WITH ALTERNATING VISIBLE AND INFRARED SENSITIVE PIXELS

(71) Applicant: Microsoft Technology Licensing, LLC, Redmond, WA (US)

(72) Inventors: Raymond Kirk Price, Redmond, WA (US); Denis Demandolx, Bellevue, WA (US); Michael Bleyer, Seattle, WA (US); Jian Zhao, Kenmore, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 372 days.

(21) Appl. No.: 15/385,713

(22) Filed: Dec. 20, 2016

(65) Prior Publication Data
US 2018/0176487 A1 Jun. 21, 2018

(51) Int. Cl.
H04N 5/33 (2006.01)
H04N 5/353 (2011.01)
H01L 27/144 (2006.01)
H01L 27/146 (2006.01)

(52) U.S. Cl.
CPC ......... *H04N 5/332* (2013.01); *H01L 27/1443* (2013.01); *H01L 27/1461* (2013.01); *H01L 27/14621* (2013.01); *H04N 5/3537* (2013.01); *H01L 27/14645* (2013.01); *H01L 27/14649* (2013.01)

(58) Field of Classification Search
CPC .. H04N 5/332; H04N 5/3537; H01L 27/1461; H01L 27/1443; H01L 27/14621; H01L 27/14649; H01L 27/14645
USPC .......................................................... 348/164
See application file for complete search history.

(56) References Cited

U.S. PATENT DOCUMENTS

| | | |
|---|---|---|
| 6,757,068 B2 | 6/2004 | Foxlin |
| 7,375,803 B1 | 5/2008 | Bamji |
| 7,566,855 B2 | 7/2009 | Olsen et al. |
| 7,672,504 B2 | 3/2010 | Childers |
| 8,446,470 B2 | 5/2013 | Lu et al. |
| 8,466,422 B2 | 6/2013 | Johnson et al. |
| 8,569,681 B2 | 10/2013 | Ovsiannikov et al. |

(Continued)

OTHER PUBLICATIONS

Cha et al, Live demonstration: An IR based facial expression tracking sensor for head-mounted display (Year: 2016).*

(Continued)

*Primary Examiner* — Shan E Elahi
(74) *Attorney, Agent, or Firm* — Alleman Hall Creasman & Tuttle LLP

(57) ABSTRACT

A sensor device is provided that includes an array of light sensitive pixels configured in a predetermined pattern of light sensitive pixels that alternates between broadband visible light sensitive pixels and infrared light sensitive pixels, each broadband visible light sensitive pixel being configured to have increased sensitivity to light of the visible light spectrum and to have reduced sensitivity to light of the infrared light spectrum compared to each infrared light sensitive pixel, and each infrared light sensitive pixel being configured to have increased sensitivity to light of the infrared light spectrum and to have reduced sensitivity to light of the visible light spectrum compared to each broadband visible light sensitive pixel.

19 Claims, 9 Drawing Sheets

(56) References Cited

U.S. PATENT DOCUMENTS

| | | | | |
|---|---|---|---|---|
| 8,723,983 | B2* | 5/2014 | Shiohara | H04N 5/217 348/221.1 |
| 8,860,814 | B2* | 10/2014 | Hiramoto | H01L 27/14621 257/225 |
| 8,917,327 | B1* | 12/2014 | Bishay | H04N 9/045 348/219.1 |
| 9,076,703 | B2* | 7/2015 | Bishay | H04N 9/045 |
| 9,122,053 | B2 | 9/2015 | Geisner et al. | |
| 2008/0050112 | A1* | 2/2008 | Wernersson | G03B 9/04 396/463 |
| 2009/0153710 | A1* | 6/2009 | John | H04N 5/23248 348/296 |
| 2012/0262558 | A1 | 10/2012 | Boger et al. | |
| 2012/0262601 | A1* | 10/2012 | Choi | H04N 5/3696 348/223.1 |
| 2013/0027598 | A1* | 1/2013 | McCarten | H01L 27/1461 348/311 |
| 2013/0329006 | A1* | 12/2013 | Boles | H04N 1/40056 348/42 |
| 2014/0014822 | A1* | 1/2014 | Mabuchi | H04N 5/35581 250/208.1 |
| 2014/0176965 | A1* | 6/2014 | Hart | A61C 5/90 356/630 |
| 2015/0097108 | A1* | 4/2015 | Bishay | H04N 9/045 250/208.1 |
| 2015/0220157 | A1* | 8/2015 | Marggraff | G06F 3/017 345/156 |
| 2015/0302659 | A1 | 10/2015 | O'connor et al. | |
| 2015/0304638 | A1 | 10/2015 | Cho et al. | |
| 2016/0161599 | A1* | 6/2016 | Seliuchenko | G01S 7/484 250/338.4 |
| 2016/0249019 | A1* | 8/2016 | Westwick | A61B 1/045 |
| 2016/0255288 | A1* | 9/2016 | Bishay | H04N 9/045 348/164 |
| 2017/0195588 | A1* | 7/2017 | Nalla | H04N 5/353 |

OTHER PUBLICATIONS

Makibuchi et al, Vision based robust calibration for optical see through head mounted displays (Year: 2013).*

"Active and Passive Modes in One IR Camera", Published on: Jan. 21, 2013 Available at: http://www.photonics.com/Article.aspx?AID=52832.

Yang, et al., "Fusion of Active and Passive Sensors for Fast 3D Capture", In Proceedings of IEEE International Workshop on Multimedia Signal Processing, Oct. 4, 2010, 6 pages.

Surur, "Daqri is a Hololens competitor that may beat Microsoft to the Enterprise punch", Published on: Apr. 18, 2016 Available at: http://mspoweruser.com/daqri-hololens-competitor-may-beat-microsoft-enterprise-punch/.

"AiR Glasses", Retrieved on: Aug. 30, 2016 Available at: http://www.atheerair.com/air-glasses.

Foxlin, et al., "WearTrack: A Self-Referenced Head and Hand Tracker for Wearable Computers and Portable VR", In Proceedings of International Symposium on Wearable Computers, Oct. 16, 2000, 8 pages.

OmniVision, "Color CMOS 4-megapixel (2688×1520) Image Sensor with OmniBSI-2 Technology". Retrieved on Nov. 8, 2016 Available at: http://www.ovt.com/products/sensor.php?id=145.

Embedded Vision Alliance, "Time of Flight: Samsung's new RGB Image Sensor Also Has Depth Sight". Retrieved on Nov. 8, 2016. Available at: http://www.embedded-vision.com/news/2012/03/01/time-flight-samsungs-new-rgb-image-sensor-also-has-depth-sight.

* cited by examiner

FIG. 6

SENSOR WITH ALTERNATING VISIBLE AND INFRARED SENSITIVE PIXELS

BACKGROUND

Different types of machine vision technologies require visible light sensors and/or infrared light sensors to perform depth sensing, mapping, and tracking functions, which may cause the number of required light sensors for such machine vision applications to increase. This increased number of light sensors can be problematic particularly for machine vision technologies executed on mobile computing devices, such as head mounted devices for augmented reality and virtual reality systems, automated vacuum cleaners, drones, and other mobile devices, which place a premium on reducing size, weight, power requirements, and costs of such devices.

SUMMARY

To address the above issues, a sensor device is provided. The sensor device may include an array of light sensitive pixels configured in a predetermined pattern of light sensitive pixels that alternates between broadband visible light sensitive pixels and infrared light sensitive pixels, each broadband visible light sensitive pixel being configured to have increased sensitivity to light of the visible light spectrum and to have reduced sensitivity to light of the infrared light spectrum compared to each infrared light sensitive pixel, and each infrared light sensitive pixel being configured to have increased sensitivity to light of the infrared light spectrum and to have reduced sensitivity to light of the visible light spectrum compared to each broadband visible light sensitive pixel.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 6 is a schematic view that shows a third example configuration for a sensor device 18 of the example computing device of FIG. 1.

DETAILED DESCRIPTION

Figure 1:
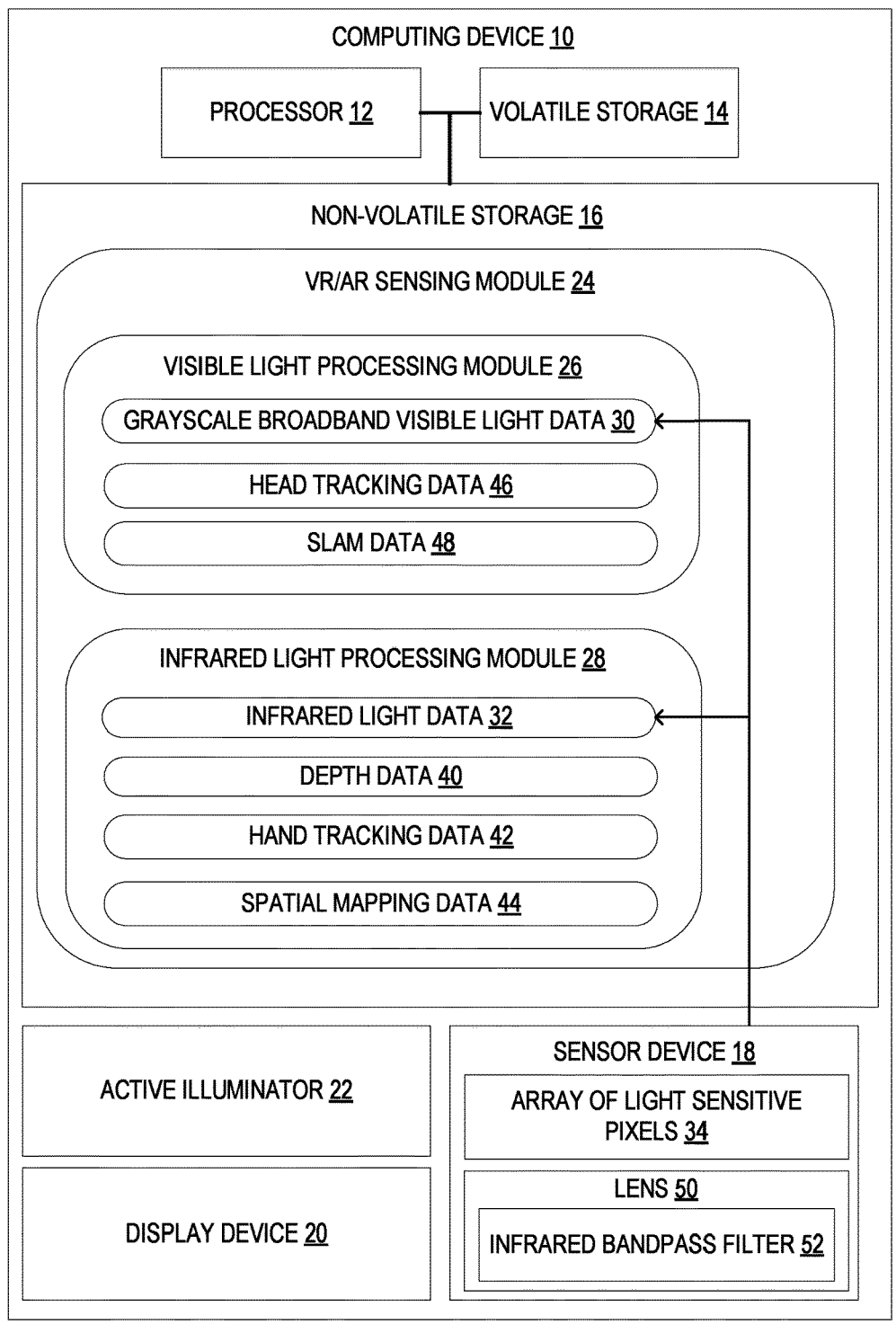
FIG. 1 is a schematic view that shows an example computing device of the present description.

FIG. 1 illustrates a computing device 10 that includes a processor 12, a volatile storage device 14, a non-volatile storage device 16, sensor devices 18, a display device 20, and an active illuminator 22. The processor 12 is configured to execute instructions stored on the non-volatile storage device 16 for a virtual reality/augmented reality (VR/AR) sensing module 24. As shown, the VR/AR sensing module 24 may include a visible light processing module 26 and an infrared light processing module 28 configured to process grayscale broadband visible light data 30 and infrared light data 32 respectively, received via the sensor device 18 of the computing device 10. Although grayscale light data is used in this specific embodiment, it will be appreciated that full visible spectrum light data may be utilized in other applications such as grayscale photo-video captures. In one example, the visible light processing module 26 is configured to perform simultaneous localization and mapping (SLAM), head tracking, and other machine vision applications based on the grayscale broadband visible light data 30. Further in this example, the infrared light processing module 28 is configured to perform hand tracking, object reconstruction, spatial mapping, and machine vision applications based on the infrared light data 32. Thus, it will be appreciated that based on the light data received via a single sensor device 18, the VR/AR sensing module 24 may be configured to concurrently perform infrared sensing and tracking and simultaneous localization and mapping, as well as other machine vision applications.

Figure 2:
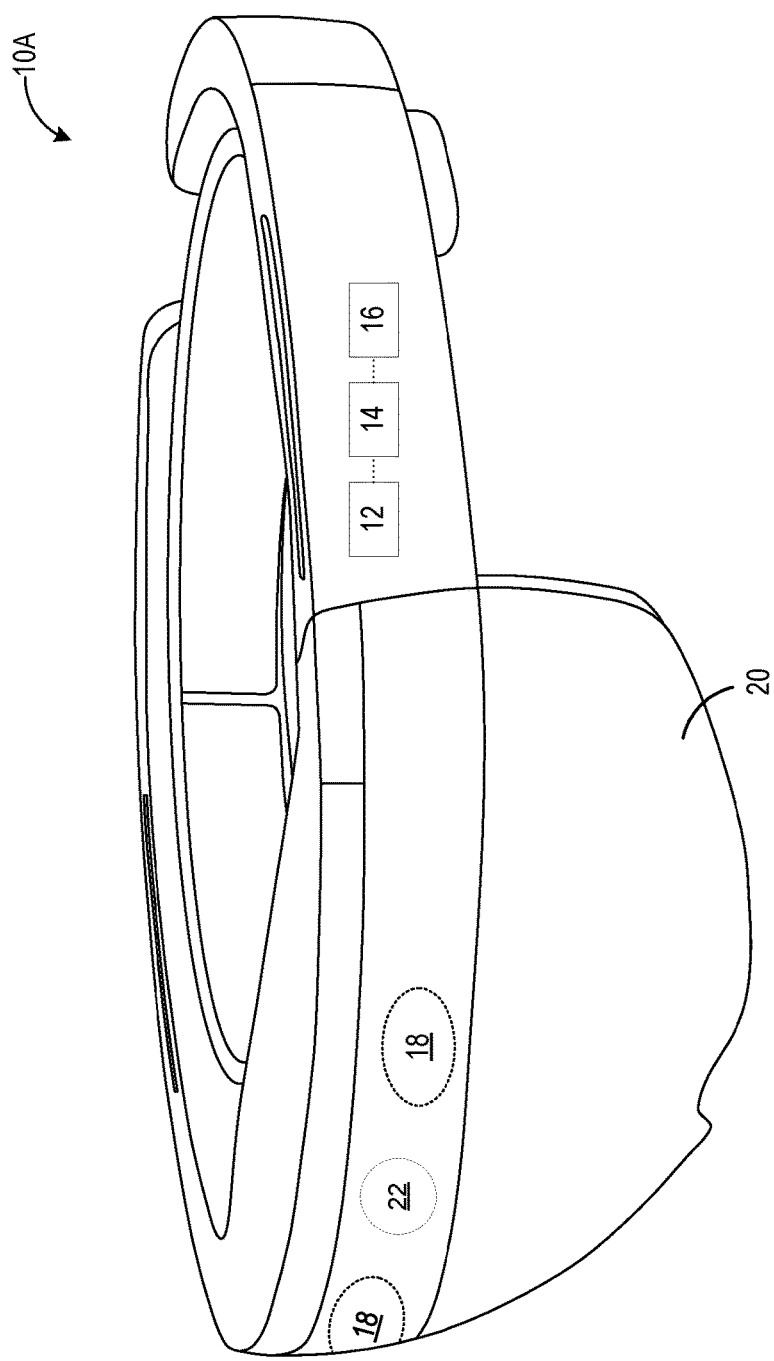
FIG. 2 is a side view that shows an example head mounted display device embodiment of the example computing device of FIG. 1.

FIG. 2 illustrates a head mounted display device 10A embodiment of the computing device 10. As shown, the head mounted display device 10A includes processor 12, volatile storage device 14, non-volatile storage device 16, active illuminator 22, display 20, and a sensor device 18. In one example, the processor 12, volatile storage device 14, and non-volatile storage device 16 may be included in a System-on-Chip configuration included in the head mounted display device 10A. It will be appreciated that the computing device 10 may also take the form of other types of mobile computing devices, such as, for example, a smartphone device, a laptop, a machine vision processing unit for an autonomous vehicle, drone, or other types of autonomous devices, etc.

As shown in FIG. 2, the head mounted display device 10A may include a sensor device 18. In one example, the head mounted display device 10A includes exactly one sensor device 18. In this example, the sensor device 18 may include a wide field of view fisheye lens. In another example, the sensor device 18 is one of a plurality of sensor devices 18 having the same configuration, and the plurality of sensor devices are located on the head mounted display device 10A with overlapping field of views of each sensor. In this example, the head mounted display device 10A may be configured to process the overlapping data of the plurality of sensor devices 18 located with overlapping field of views, to determine depth data using passive stereo depth estimation techniques. In other configurations, depth data may be determined through the use of phase or gated Time of Flight, or through the use of Structured Light depth imaging techniques. In another example, the plurality of sensor devices 18 are located on the head mounted display device 10A with non-overlapping field of views. In this example, the plurality of sensor devices 18 may be located on opposite sides of the head mounted display device 10A such that the field of views of the plurality of sensor devices 18 do not overlap. In this example, the plurality of sensor devices 18 may be configured for a three-hundred and sixty degree field of view around the head mounted display device 10A. It will be appreciated that the plurality of sensor devices 18 may be located on the head mounted display device 18 in other positional configurations to achieve a suitable field of view.

Figure 3:
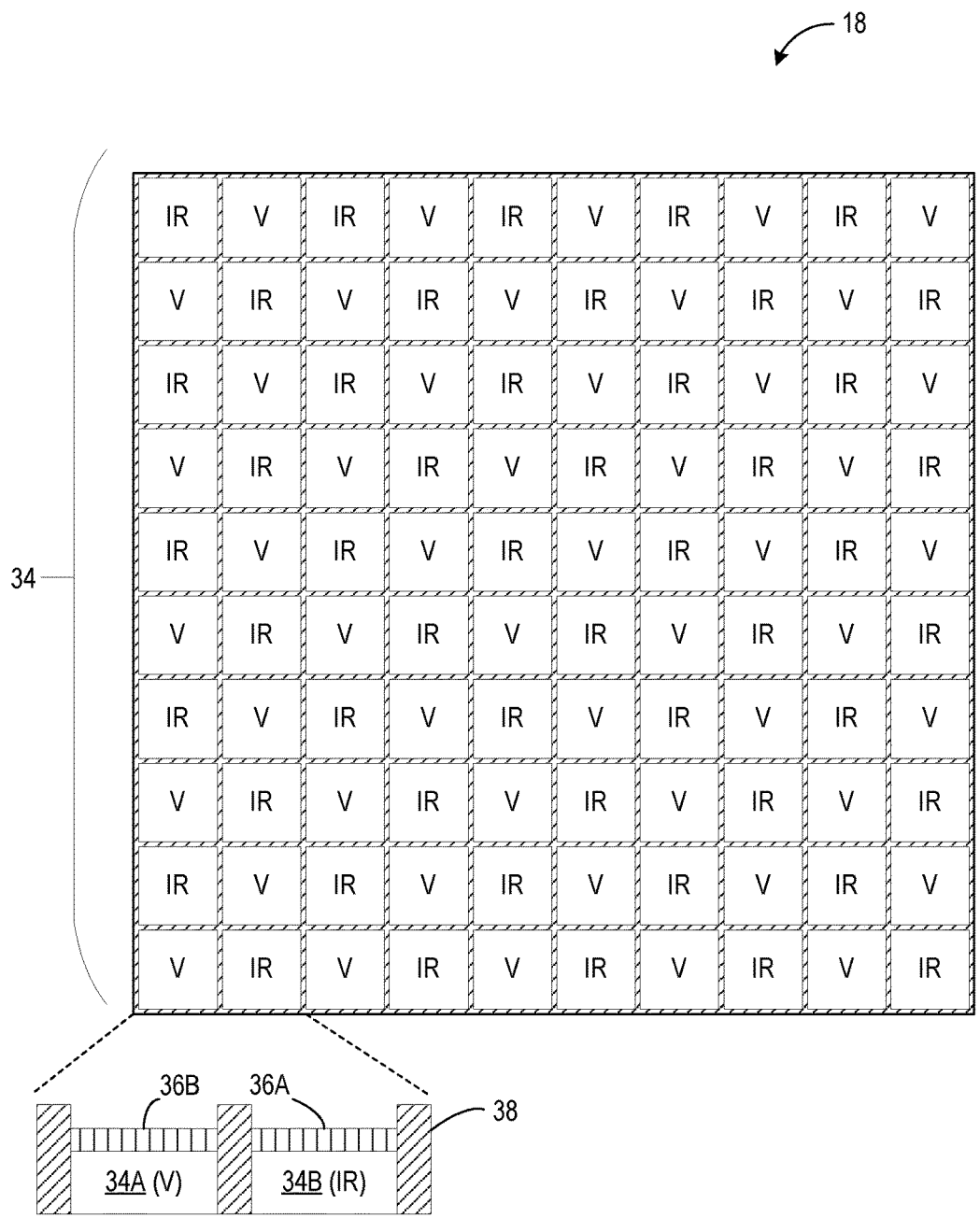
FIG. 3 is a schematic view that shows a first example configuration for a sensor device 18 of the example computing device of FIG. 1.

Turing to FIG. 3, the sensor devices 18 are configured to detect light of both the infrared light spectrum and the visible light spectrum in the field of view of the sensor device. As illustrated in FIG. 3, each sensor device 18 includes an array of light sensitive pixels 34. The array of light sensitive pixels 34 include both broadband visible light sensitive pixels 34A (V) and infrared light sensitive pixels 34B (IR). In one example, the array of light sensitive pixels 34 is a complementary metal-oxide-semiconductor (CMOS) sensor or a charge-coupled device (CCD), and the light sensitive pixels 34 are represented by p-doped metal-oxide-semiconductors (MOS). In another example, the array of light sensitive pixels 34 is an active-pixel sensor (APS). However, it will be appreciated that other suitable light sensor technologies may also be utilized. In this example, the array of light sensitive pixels 34 is configured in a predetermined pattern of light sensitive pixels that alternates between broadband visible light sensitive pixels 34A (V) and infrared light sensitive pixels 34B (IR).

In the example illustrated in FIG. 3, the predetermined pattern of light sensitive pixels is a checkerboard pattern. In the checkboard pattern, the light sensitive pixels vertically and horizontally adjacent to a broadband visible light sensitive pixel 34A are infrared light sensitive pixels 34B. Moreover, the light sensitive pixels vertically and horizontally adjacent to an infrared light sensitive pixel 34B are broadband visible light sensitive pixels 34A. Thus, no broadband light sensitive pixels 34A are vertically or horizontally adjacent to another broadband light sensitive pixel 34A, and no infrared light sensitive pixels 34B are vertically or horizontally adjacent to another infrared light sensitive pixel 34B. In this example, the array of light sensitive pixels 34 includes an equal number of broadband visible light sensitive pixels 34A and an equal number of infrared light sensitive pixels 34B in a fifty-fifty split. However, it will be appreciated that the array of light sensitive pixels 34 may comprise other suitable distributions of light sensitive pixels, such as, for example, a sixty-forty distribution, a seventy five-twenty five distribution, or other pixel layout configurations suitable for the intended machine vision application of the sensor device 18.

Figure 4:
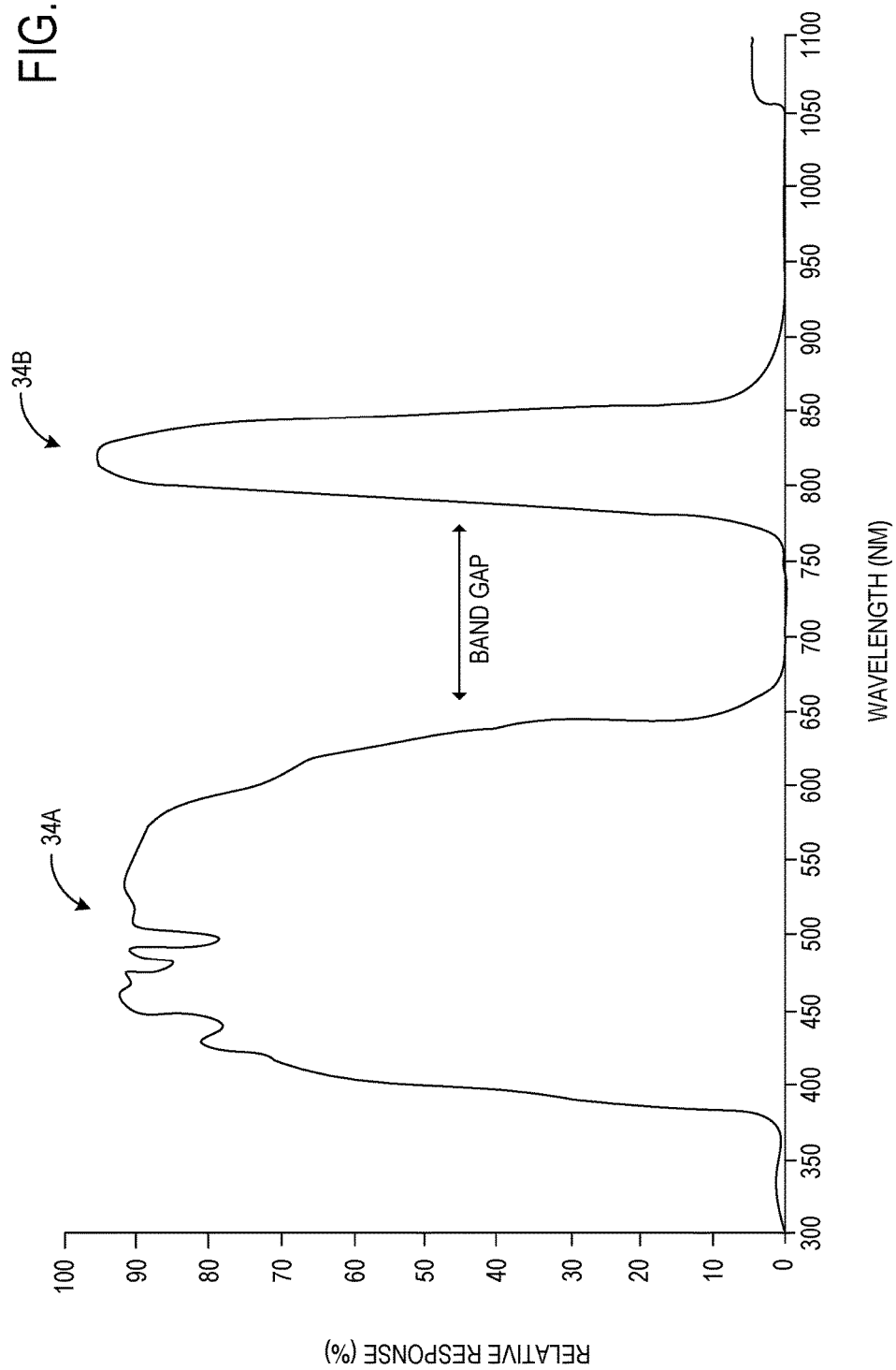
FIG. 4 is a graph that shows relative responses to light for light sensitive pixels of the example sensor device 18 of the example computing device of FIG. 1.

Turning briefly to FIG. 4, in one example, the broadband visible light sensitive pixels 34A are configured to have increased sensitivity to light in the 400 nm to 700 nm range, and the infrared light sensitive pixels 34B are configured to have increased sensitivity to light in the 700 nm to 1000 nm range. In one example, each broadband visible light sensitive pixel 34A includes red, green, and blue (RGB) subpixel sensors, and the output of the RGB subpixel sensors are combined to generate broadband visible light data that reflects light received by the broadband visible light sensitive pixel 34A in the 400 nm to 700 nm range. In one example, the broadband visible light sensitive pixels 34A are configured to output grayscale values in the form grayscale broadband visible light data 30 that may be processed by the visible light processing module 26. Alternatively, the broadband visible light sensitive pixels may be configured to output values over a range of the full visible light spectrum, or a portion thereof.

In one example, each broadband visible light sensitive pixel 34A is configured to have increased sensitivity to light of the visible light spectrum and to have reduced sensitivity to light of the infrared light spectrum compared to each infrared light sensitive pixel 34B, and each infrared light sensitive pixel 34B is configured to have increased sensitivity to light of the infrared light spectrum and to have reduced sensitivity to light of the visible light spectrum compared to each broadband visible light sensitive pixel 34A.

As shown in FIG. 4, each broadband visible light sensitive pixel 34A may be configured to be sensitive to light in the 400 nm to 700 nm range, and to have a reduced response to light in the 700 nm to 1000 nm range. Likewise, each infrared light sensitive pixel 34B may be configured to be sensitive to light in the 700 nm to 1000 nm range, and to have a reduced response to light in the 400 nm to 700 nm range. The infrared to visible light sensor contrast ratio may be limited by the technology of the dyes/tints used in the semiconductor manufacturing process. In one example, each infrared light sensitive pixel 34B may be configured to have a responsiveness to visible light that is limited to be as close to zero as permitted by the technology of the dyes/tints, such that each infrared light sensitive pixel 34B is configured to not detect substantially any visible light. However, it will be appreciated that there may be some amount of scatter or leakage from the broadband visible light sensitive pixels to the infrared light sensitive pixels. Similarly, each broadband visible light sensitive pixels 34A may be configured to have a reduced responsiveness to infrared light that is limited to be as close to zero as permitted by the technology of the dyes/tints, such that each broadband visible light sensitive pixel 34A is configured to not detect substantially any infrared light.

In one example, each broadband visible light sensitive pixel may be configured to have an extinction for visible light to infrared light of at least five to one. In this example, each infrared light sensitive pixel may be configured to have an extinction ratio for infrared light to visible light of at least four to one. It will be appreciated that other extinction ratios are possible depending on the technology of the dyes/tints used in the semiconductor manufacturing process.

In the example illustrated in FIG. 3, to achieve the relative responsiveness to light for the broadband visible light sensitive pixels 34A and infrared light sensitive pixels 34B discussed above, the sensor device 18 further includes a color filter array of visible light filters 36A and infrared light filters 36B. In one example, each infrared light sensitive pixel 34B includes a visible light filter 36A configured to filter out visible light, and each broadband visible light sensitive pixel 34A includes an infrared light filter 36B configured to filter out infrared light. For example, the visible light filters 36A may be configured to filter out light in the 400 nm to 650 nm range, and the infrared light filters 36B may be configured to filter out light in the 750 nm to 900 nm range. Thus, the visible light filters 36A further reduce the responsiveness of each infrared light sensitive pixel 34B to visible light, and the infrared light filters 36B further reduce the responsiveness of each broadband visible light sensitive pixel 34A to infrared light. In one example, the visible light filters 36A and infrared light filters 36B of the color filter array are coated on the light sensitive pixels of the sensor device 18. However, it will be appreciated that other suitable or filter arrays may also be utilized.

Further in the example illustrated in FIG. 3, each light sensitive pixel is trenched such that each light sensitive pixel is optically isolated from each other light sensitive pixel of the array of light sensitive pixels 34. As shown, each light sensitive pixel, including the broadband light sensitive pixels 34A and the infrared light sensitive pixels 34B are trenched in the sensor 18 such that each light sensitive pixel is lower than walls 38 of the sensor device 18. In the trenched configuration, each light sensitive pixel is optically isolated from any neighboring light sensitive pixels. Thus, photons detected by one light sensitive pixel are isolated and prevented from being detected by another light set sit e pixel by the walls 38 of the sensor device surrounding each light sensitive pixel.

In one example, the sensor device 18 may further comprise a lens 50 that includes an infrared bandpass filter 52 configured to isolate ambient infrared light from the infrared light sensitive pixels 34B, and thus reduce unwanted sources of infrared ambient light that may otherwise be detected by the infrared light sensitive pixels 34B.

In the example sensor device 18 that includes a color filter array, infrared bandpass filter 52, and configured for trenching of the light sensitive pixels to optically isolate each light sensitive pixel, the relative sensitivities to light of the light sensitive pixels may include a band gap in the 650 nm to 750 nm range, such that both the broadband visible light sensitive pixels 34A and the infrared light sensitive pixels 34B are configured to have reduced sensitivity to light in the band gap range, as shown in FIG. 4. Thus, such a configuration reduces optical crosstalk between the broadband visible light sensitive pixels 34A and the infrared light sensitive pixels 34B and improves image quality factors such as modulation transfer function (MTF) of the sensor device 18.

Figure 5:
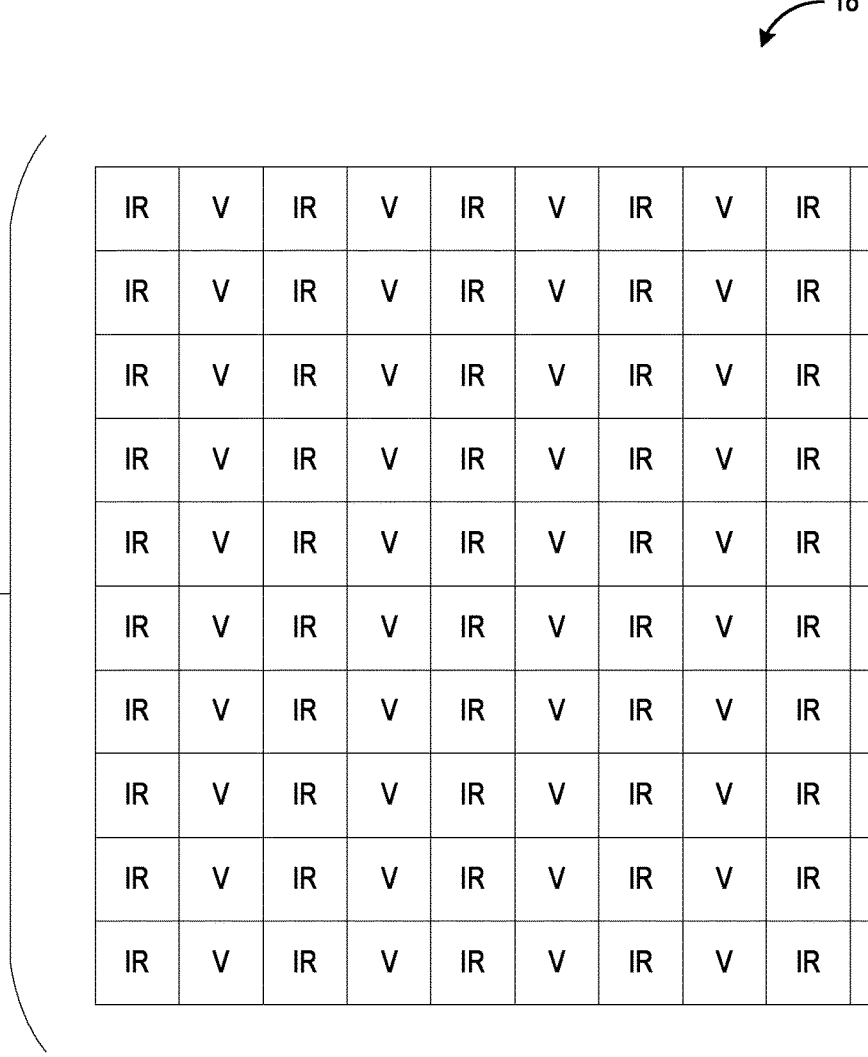
FIG. 5 is a schematic view that shows a second example configuration for a sensor device 18 of the example computing device of FIG. 1.

Now turning to FIG. 5, another example predetermined pattern for the array of light sensitive pixels 34 of sensor device 18 is illustrated. As shown, rather than a checkerboard pattern, the predetermined pattern of light sensitive pixels alternates between columns of broadband visible light sensitive pixels and columns of infrared light sensitive pixels. Thus, in this predetermined pattern, each broadband visible light sensitive pixel 34A is vertically adjacent to another broadband visible light sensitive pixel 34A, and is horizontally adjacent to infrared light sensitive pixels 34B. Moreover, each infrared light sensitive pixel 34B is vertically adjacent to another infrared light sensitive pixel 34B, and is horizontally adjacent to broadband visible light sensitive pixels 34A.

Figure 6:
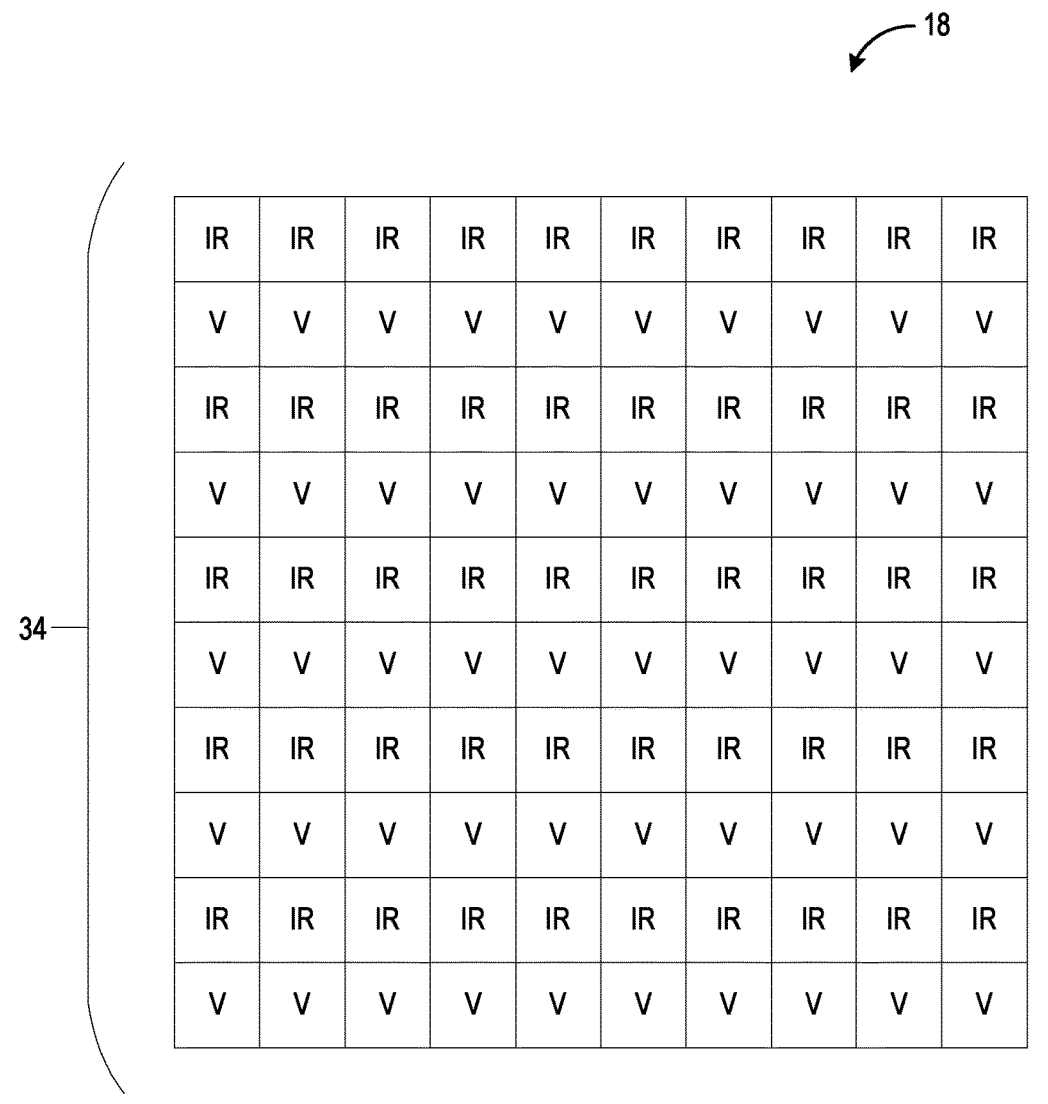

FIG. 6 shows yell to other example predetermined pattern for the array of light sensitive pixels 34 of sensor device 18. As shown, the predetermined pattern of light sensitive pixels alternates between rows of broadband visible light sensitive pixels and rows of infrared light sensitive pixels. Thus, in this predetermined pattern, each broadband visible light sensitive pixel 34A is horizontally adjacent to another broadband visible light sensitive pixel 34A, and is vertically adjacent to infrared light sensitive pixels 34B. Moreover, each infrared light sensitive pixel 34B is horizontally adjacent to another infrared light sensitive pixel 34B, and is vertically adjacent to broadband visible light sensitive pixels 34A.

In the predetermined patterns illustrated in FIGS. 3, 5, and 6, the infrared light processing module 28 may be configured to process the infrared light data 32 output by the sensor devices 18 to determine depth data 40 based on structured light depth sensing techniques. Thus, as illustrated in FIG. 1, the computing device may include an active illuminator 22 configured to project structured light onto the environment in the field of view of the sensor devices 18. The structured light, may for example, take the form of dots of infrared light projected in a grid onto surfaces of the environment. Thus, the infrared sensitive light pixels of the sensor devices 18 are configured to detect the structured light that is projected from the active illuminator 22 and reflected off of surfaces of the environment in the field of view of the sensor device 18. Next, based on the infrared light data 32, which includes the detected infrared structured light, the infrared light processing module 28 may determine depth data 40 for the surfaces of the e a t relative to the computing device 10. As shown in FIG. 2, the head mounted display 10A configuration may also include an active illuminator 22 located separately from the sensor devices 18.

Figure 7:
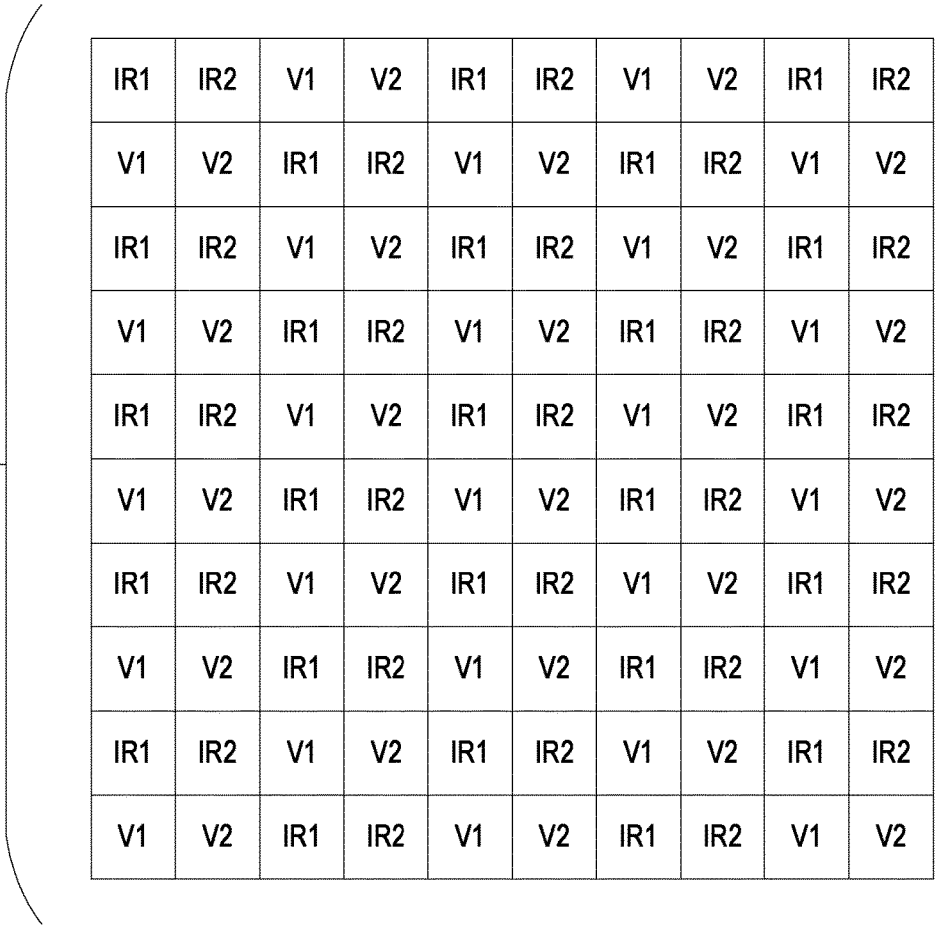
FIG. 7 is a schematic view that shows a fourth example configuration for a sensor device 18 of the example computing device of FIG. 1.

In another example, the computing device 10 may determine depth data 40 based on time of flight (ToF) techniques. Turning to FIG. 7, in this example, each broadband visible light sensitive pixel 34A includes two or more differential visible light sensitive pixels (V1, V2), and each infrared light sensitive pixel 34B includes two or more differential infrared light sensitive pixels (IR1, IR2). Thus, as drown in FIG. 7 the predetermined pattern of light sensitive pixels alternates between groups of two or more differential visible light sensitive pixels (V1, V2), and groups of two or more differential infrared light sensitive pixels (IR1, IR2). In this example, the active illuminator 22 illuminates the environment in the field of view of the sensor device 18 in pulses, and the time of flight for the photons in a pulse to travel from the active illuminator to a surface of the environment, and back to the sensor device 18 of the computing device 10 is determined based on output of the sensor device 18.

In examples of the sensor device 18 illustrated in FIGS. 3, 5, 6, and 7, the sensor device 18 may be configured to concurrently expose the broadband visible light sensitive pixels 34A and the infrared light sensitive pixels 34B of the array of light sensitive pixels 34. Thus, both a broadband visible light image and an infrared light image may be simultaneously or concurrently captured for the environment within the field of view of the sensor device 18. Both the broadband visible light image and the infrared light image may be sent to the VR/AR sensing module 24 in the form of grayscale broadband visible light data 30 and infrared light data 32. Optionally the visible light info nation may be used in conjunction with the depth information for spatial mapping, hand tracking, and object capture/mapping applications.

Further in the examples of the sensor device 18 illustrated in FIGS. 3, 5, 6, and 7, the infrared light sensitive pixels 34B are configured to be globally shuttered. For example, the array of light sensitive pixels 34 may take the form of a CCD or active-pixel sensors, and the sensor device 18 may be configured to turn off, or otherwise shutter all of the infrared light sensitive pixels 34B simultaneously. Further in this example, the broadband visible light sensitive pixels 34A may also be configured to be globally shuttered by the sensor device 18. Alternatively, in one example, the infrared light sensitive pixels 34B and the broadband visible light sensitive pixels 34A may be configured to be rolling shuttered. In some configurations, the broadband visible light sensitive pixels 34A may be rolling shuttered, while the infrared light sensitive pixels 34B are globally shuttered. It will be appreciated that other combinations and types of shuttering techniques may be utilized by the sensor device 18 to shutter the broadband visible light sensitive pixels 34A and the infrared light sensitive pixels 34B.

In another example, the sensor device 18 may be configured to shutter the infrared light sensitive pixels 34B separately from or in conjunction with the broadband visible light sensitive pixels 34A. In this example, the sensor device 18 may be further configured to control a first shutter speed for the broadband visible light sensitive pixels 34A independently of a second shutter speed for the infrared light sensitive pixels 34B. Thus, the sensor device 18 may be configured to capture frames for the broadband visible light images at a separate rate than frames for the infrared light images. In this example, a stream of broadband visible light image may be sent to the VR/AR sensing module 24 separately from a stream of infrared light images. However, it will be appreciated that both streams of images may be captured and originate from the same sensor device 18 according to the methods described herein.

Turning back to FIG. 1, output of the sensor devices 18, including both grayscale broadband visible light data 30 and infrared light data 32 are respectively received by the visible light processor module 26 and the infrared light processing module 28 of the VR/AR sensing module 24. As discussed above, the VR/AR sensing module 24 may receive the streams of grayscale (or color) broadband visible light data 30 and infrared light data 32 concurrently. Thus, in one example, processor 12 is configured to concurrently perform infrared sensing and tracking and simultaneous localization and snapping based on output of the sensor device 18. In particular, the visible light processing module 26 may process the grayscale broadband visible light data 30 concurrently with the infrared light processing module 28 processing the infrared light data 32 based on output from the sensor device 18. It will be appreciated that grayscale broadband visible light data 30 and the infrared light data 32 may be processed for many different machine vision application functions.

For example, in the head mounted display 10A embodiment of computing device 10, the infrared light data 32 may be processed to determine depth data 40. The depth data 40 may be further processed to determine hand tracking data 42 and spatial mapping data 44. The spatial mapping data 44 may be used by the VR/AR sensing module 24 to map the environment surrounding the user of the head mounted display device 10A. The hand tracking data 42 may be passed to other modules or applications executed on the head mounted display device 10A embodiment of computing device 10, such as, for example, a gesture detection module or a virtual reality game application. In other examples, the hand tracking data 42 may be determined based on the infrared light data 32 without first processing depth data 40.

As illustrated in FIG. 1, the grayscale broadband visible light data 30 may be processed by the visible light processing module 26 to determine head tracking data 46. In the head mounted display 10A embodiment of computing device 10, the head tracking data 46 may be used to track the user's head movement, pose, and position within the surrounding environment mapped by the VR/AR sensing module 24 using the spatial mapping data 44. The visible light processing module 26 may be further configured to perform SLAM, and process the grayscale broadband visible light data 30 to determine various SLAM data 18, such as surface and object recognition, etc.

It will be appreciated that the above described machine vision functions are merely exemplary, and any other suitable machine vision functions not described above may also be executed by the processor 12 based on the grayscale broadband visible light data 30 and the infrared light data 32 concurrently output from the sensor devices 18.

Figure 8:
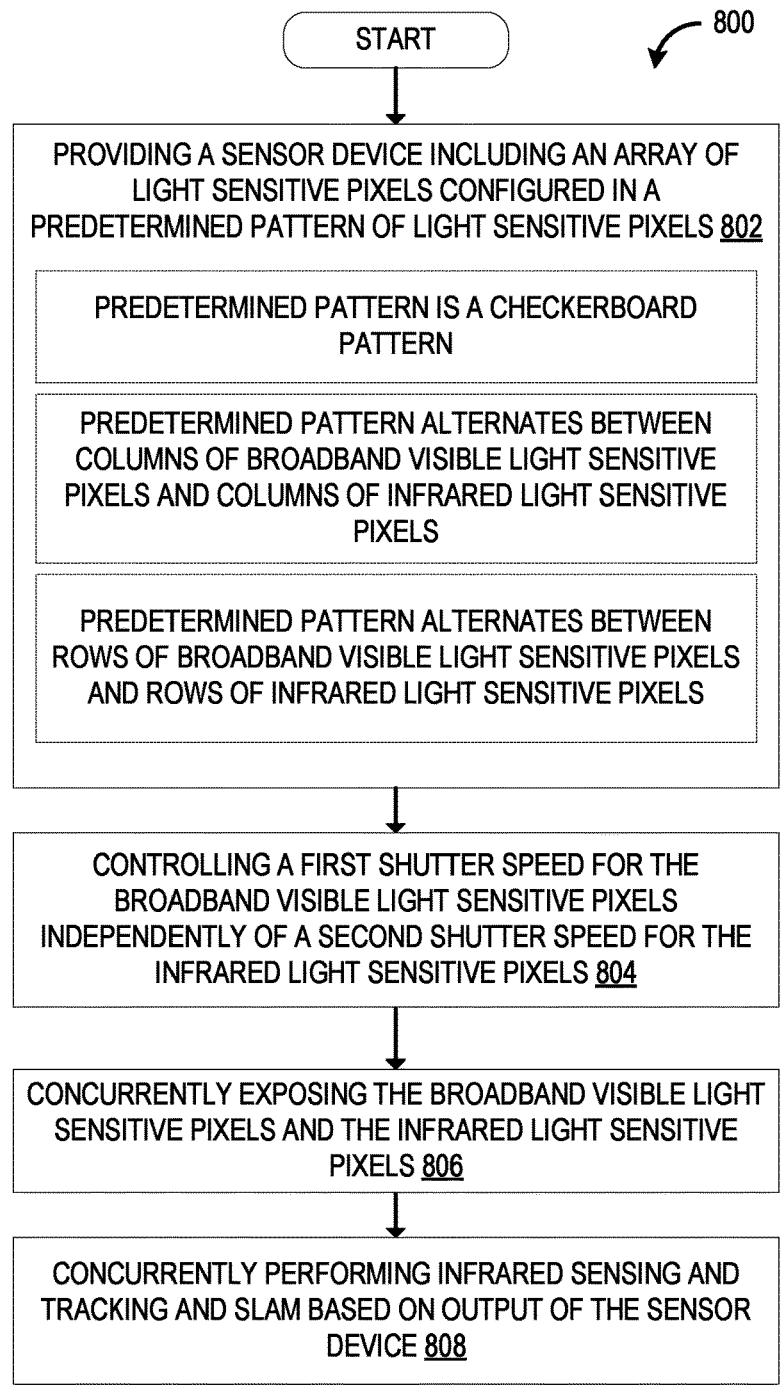
FIG. 8 shows an example method for a utilizing a sensor with broadband visible and infrared light sensing, according to one embodiment of the present disclosure.

FIG. 8 shows an example method 800 according to an embodiment of the present disclosure. At step 802, the method 800 may include providing a sensor device including an array of light sensitive pixels configured in a predetermined pattern of light sensitive pixels that alternates between broadband visible light sensitive pixels and infrared light sensitive pixels. Each broadband visible light sensitive pixel may be configured to have increased sensitivity to light of the visible light spectrum and to have reduced sensitivity to light of the infrared light spectrum. For example, each broadband visible light sensitive pixel may be coated with an infrared light filter, such that each broadband visible light sensitive pixel is sensitive to light in the 400 nm to 700 nm range and having reduced sensitivity to light in the 700 nm to 1000 nm range. Additionally, each infrared light sensitive pixel may be configured to have increased sensitivity to light of the infrared light spectrum and to have reduced sensitivity to light of the visible light spectrum. Similarly, each infrared light sensitive pixel may be coated with a visible light filter, such that each infrared light sensitive pixel is sensitive to light in the 700 nm to 1000 nm range and having reduced sensitivity to light in the 400 nm to 700 nm range.

In one example, the predetermined pattern of light sensitive pixels is a checkerboard pattern, in particular, the array of light sensitive pixels may be configured such that each broadband visible light sensitive pixel is horizontally and vertically adjacent to infrared light sensitive pixels, and each infrared light sensitive pixel is horizontally and vertically adjacent to broadband visible light sensitive pixels.

In another example, the predetermined pattern of light sensitive pixels alternates between columns of broadband visible light sensitive pixels and columns of infrared light sensitive pixels. In particular, the array of light sensitive pixels may be configured such that each broadband visible light sensitive pixel is vertically adjacent to other broadband visible light sensitive pixels, and horizontally adjacent to infrared light sensitive pixels. Moreover, each infrared light sensitive pixel is vertically adjacent to other infrared light sensitive pixels, and horizontally adjacent to broadband visible light sensitive pixels.

In another example, the predetermined pattern of light sensitive pixels alternates between rows of broadband visible light sensitive pixels and rows of infrared light sensitive pixels. In particular, the array of light sensitive pixels may be configured such that each broadband visible light sensitive pixel is horizontally adjacent to other broadband visible light sensitive pixels, and vertically adjacent to infrared light sensitive pixels. Moreover, each infrared light sensitive pixel is horizontally adjacent to other infrared light sensitive pixels, and vertically adjacent to broadband visible light sensitive pixels.

Proceeding from step 802 to step 804, the method 800 may include controlling a first shutter speed for the broadband visible light sensitive pixels independent of a second shutter speed for the infrared light sensitive pixels. In one example, the array of light sensitive pixels is a CCD or active-pixel sensor, and the sensor device 18 is configured to turn off, or otherwise shutter all of the broadband visible light sensitive pixels independently of turning off, or otherwise shutting all of the infrared light sensitive pixels.

Advancing from step 804 to step 806, the method 800 may include concurrently exposing the broadband visible light sensitive pixels and the infrared light sensitive pixels. In one example, the sensor device 18 is configured to concurrently capture a stream of broadband visible light images and a stream of infrared light images of the environment in the field of view of the sensor device 18. The streams are concurrently sent to the VR/AR sensing module 24, which may process both the broadband visible light data as well as the infrared light data concurrently.

Proceeding from step 806 to step 808, the method 800 may include concurrently perform infrared sensing and tracking and simultaneous localization and mapping based on output of the sensor device. For example, the head mounted display device 10A embodiment of computing device 10 may be configured to concurrently perform head tracking based on grayscale broadband visible light data and perform hand tracking based on infrared light data, based on output received from sensor device 18. However, it will be appreciated that other types of depth sensing and tracking, and other machine vision functions may also be concurrently performed based on the output of sensor device 18.

The above described systems and methods may be used to produce and utilize a sensor device that concurrently senses both broadband visible light and infrared light in the same sensor, potentially reducing the size, weight, power consumption, and cost as compared to devices using separate sensors to detect visible and infrared light, and allowing the same field of view to be imaged by the same sensor from the same perspective. The resulting images produced by these sensors can take the same form as the layouts shown in FIGS. 3, 5, 6, and 7.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
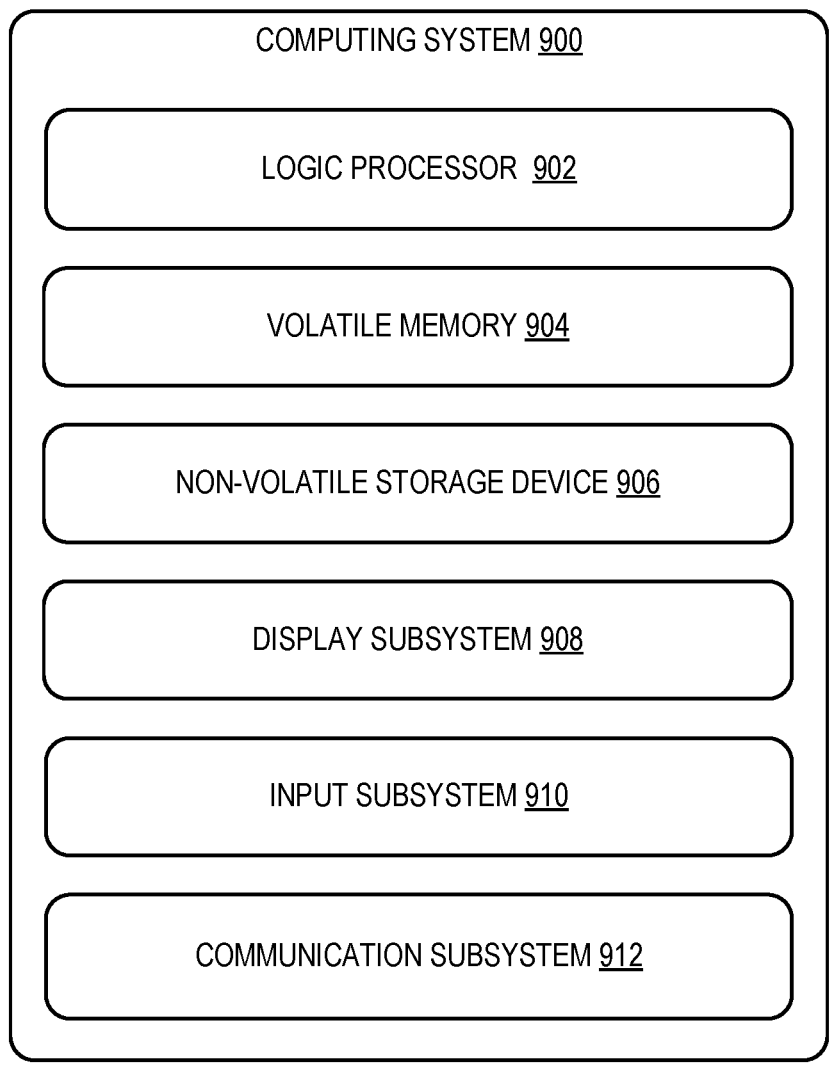
FIG. 9 shows an example computing system according to an embodiment of the present description.

FIG. 9 schematically shows a non-limiting embodiment a computing system 900 that can enact one or more of the methods and processes described above. Computing system 900 is shown simplified form. Computing system 900 may embody the computing device 10 of FIG. 1. Computing system 900 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

Computing 900 includes a logic processor 902 volatile memory 904, and a non-volatile storage device 906. Computing system 900 may optionally include a display subsystem 908, input subsystem 910, communication subsystem 912, and/or other components not shown in FIG. 9.

Logic processor 902 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 902 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 906 includes one or more physical devices configured to hold instructions executable by the logic processors to implement the methods and processes described herein. When such methods and processes are implemented, the state of non-volatile storage device 904 may be transformed—e.g., to different data.

Non-volatile storage device 906 may include physical devices that are removable and/or built-in. Non-volatile storage device 94 may include optical memory (e.g., CD, DVD, HD-DVD, Blu-Ray Disc, etc.), semiconductor memory (e.g., ROM, EPROM, EEPROM, FLASH memory, etc.) and/or magnetic memory hard-disk drive, floppy-disk drive, tape drive, MRAM, etc.), or other mass storage device technology. Non-volatile storage device 906 may include nonvolatile, dynamic, static, read/write, read-only, sequential-access, location-addressable, file-addressable, and/or content-addressable devices. It will be appreciated that non-volatile storage device 906 is configured to hold instructions even when power is cut to the non-volatile storage device 906.

Volatile memory 904 may include physical devices that include random access memory. Volatile memory 904 is typically utilized by logic processor 902 to temporarily store information during processing of software instructions. It will be appreciated that volatile memory 904 typically does not continue to store instructions when power is cut to the volatile memory 904.

Aspects of logic processor 902, volatile memory 904, and non-volatile storage device 906 may be integrated together one or more hardware-logic components. Such hardware-logic components may include field-programmable gate arrays (FPCAs), program- and application-specific integrated circuits (PASIC/ASICs), program- and application-specific standard products (PSSP/ASSPs), system-on-a-chip (SOC) and complex programmable logic devices (CPLDs), for example.

The terms"module," "program," and "engine" may be used to describe an aspect of computing system 900 typically implemented in software by a processor to perform a particular function using portions of volatile memory, which function involves transformative processing that specially configures the processor to perform the function. Thus, a module, program, or engine may be instantiated via logic processor 902 executing instructions held by non-volatile storage device 906, using portions of volatile memory 904. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

When included, display subsystem 908 may be used to present a visual representation of data held by non-volatile storage device 906. The visual representation may take the form of a graphical user interface (GUI). As the herein described methods and processes change the data held by the non-volatile storage device, and thus transform the state of the non-volatile storage device, the state of display subsystem 908 may likewise be transformed to visually represent changes in the underlying data. Display subsystem 908 may include one or more display devices utilizing virtually any type of technology. Such display devices may be combined with logic processor 902, volatile memory 904, and/or non-volatile storage device 906 in a shared enclosure, or such display devices may be peripheral display devices.

When included, input subsystem 910 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 912 may be configured to communicatively couple various computing devices described herein with each other, and with other devices. Communication subsystem 912 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 900 to send and/or receive messages to and/or from other devices via a network such as the Internet.

The following paragraphs provide additional support for the claims of the subject application. One aspect provides a sensor device comprising an array of light sensitive pixels configured in a predetermined pattern of light sensitive pixels that alternates between broadband visible light sensitive pixels and infrared light sensitive pixels, each broadband visible light sensitive pixel being configured to have increased sensitivity to light of the visible light spectrum and to have reduced sensitivity to light of the infrared light spectrum compared to each infrared light sensitive pixel, and each infrared light sensitive pixel being configured to have increased sensitivity to light of the infrared light spectrum and to have reduced sensitivity to light of the visible light spectrum compared to each broadband visible light sensitive pixel. In this aspect, additionally or alternatively, the broadband visible light sensitive pixels may be configured to have increased sensitivity to light in the 400 nm to 700 nm range, and the infrared light sensitive pixels may be configured to have increased sensitivity to light in the 700 nm to 1000 nm range. In this aspect, additionally or alternatively, relative sensitivities to light of the light sensitive pixels may include a band gap in the 650 nm to 750 nm range, wherein both the broadband visible light sensitive pixels and the infrared light sensitive pixels may be configured to have reduced sensitivity to light in the band gap range. In this aspect, additionally or alternatively, the sensor device may further comprise a color filter array of visible light filters and infrared light filters, wherein each infrared light sensitive pixel may include a visible light filter configured to filter out visible light, and each broadband visible light sensitive pixel may include an infrared light filter configured to filter out infrared light. In this aspect, additionally or alternatively, the sensor device may further comprise a lens that may include an infrared bandpass filter configured to isolate ambient infrared light from the infrared light sensitive pixels. In this aspect, additionally or alternatively, the predetermined pattern of light sensitive pixels may be a checkerboard pattern. In this aspect, additionally or alternatively, the predetermined pattern of light sensitive pixels may alternate between columns of broadband visible light sensitive pixels and columns of infrared light sensitive pixels. In this aspect, additionally or alternatively, the predetermined pattern of light sensitive pixels may alternate between rows of broadband visible light sensitive pixels and rows of infrared light sensitive pixels. In this aspect, additionally or alternatively, each broadband visible light sensitive pixel may include two or more differential visible light sensitive pixels, and each infrared light sensitive pixel may include two or more differential infrared light sensitive pixels. In this aspect, additionally or alternatively, the broadband visible light sensitive pixels may be configured to output grayscale values. In this aspect, additionally or alternatively, the infrared light sensitive pixels may be configured to be globally shuttered. In this aspect, additionally or alternatively, the infrared light sensitive pixels and the broadband visible light sensitive pixels may be configured to be rolling shuttered. In this aspect, additionally or alternatively, the sensor device may be further configured to control a first shutter speed for the broadand visible light sensitive pixels independently of a second shutter speed for the infrared light sensitive pixels. In this aspect, additionally or alternatively, the sensor device may be further configured to concurrently expose the broadband visible light sensitive pixels and the infrared light sensitive pixels. In this aspect, additionally or alternatively, each light sensitive pixel may be trenched such that each light sensitive pixel may be optically isolated from each other light sensitive pixel of the array of light sensitive pixels.

Another aspect provides a method comprising providing a sensor device including an array of light sensitive pixels configured in a predetermined pattern of light sensitive pixels that alternates between broadband visible light sensitive pixels and infrared light sensitive pixels, each broadband visable light sensitive pixel being configured to have increased sensitivity to light of the visible light spectrum and to have reduced sensitivity to light of the infrared light spectrum compared to each infrared light sensitive pixel, and each infrared light sensitive pixel being configured to have increased sensitivity to light of the infrared light spectrum and to have reduced sensitivity to light of the visible light spectrum compared to each broadband visible light sensitive pixel, and concurrently performing infrared sensing and tracking and simultaneous localization and mapping based on output of the sensor device.

Another aspect provides a head mounted display device comprising a sensor device including an array of light sensitive pixels configured in a predetermined pattern of light sensitive pixels that alternates between broadband visible light sensitive pixels and infrared light sensitive pixels, each broadband visible light sensitive pixel being configured to have increased sensitivity to light of the visible light spectrum and to have reduced sensitivity to light of the infrared light spectrum compared to each infrared light sensitive pixel, and each infrared light sensitive pixel being configured to have increased sensitivity to light of the infrared light spectrum and to have reduced sensitivity to light of the visible light spectrum compared to each broadband visible light sensitive pixel, and a processor configured to concurrently perform infrared sensing and tracking and simultaneous localization and mapping based on output of the sensor device. In this aspect, additionally or alternatively, the head moaned display device may further comprise an active illuminator. In this aspect, additionally or alternatively, the sensor device may be one of a plurality of sensor devices having the same configuration, and the plurality of sensor devices may be located on the head mounted display device with overlapping field of views. In this aspect, additionally or alternatively, the sensor device may be one of a plurality of sensor devices having the same configuration, and the plurality of sensor devices may be located on the head mounted display device with non-overlapping field of views.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be preformed in the sequence illustrated and/or described, in other sequences, in parallel, or omitted. Likewise, the order of the above-described processes may be changed.

The subject matter of the present disclosure, includes all novel and nonobvious combinations and subcombinations of the various processes, systems and configurations, and other features, functions, acts, and/or properties disclosed herein, as well as any and all equivalents thereof.

The invention claimed is:

1. A sensor device, comprising:
an array of light sensitive pixels arranged in a predetermined pattern of light sensitive pixels that alternates between broadband visible light sensitive pixels and infrared light sensitive pixels;
a color filter array of visible light filters and infrared light filters;
each broadband visible light sensitive pixel including a respective infrared light filter of the color filter array that causes that broadband visible light sensitive pixel to have increased sensitivity to light of the visible light spectrum and to have reduced sensitivity to light of the infrared light spectrum compared to each infrared light sensitive pixel; and
each infrared light sensitive pixel including a respective visible light filter of the color filter array that causes that infrared light sensitive pixel to have increased sensitivity to light of the infrared light spectrum and to have reduced sensitivity to light of the visible light spectrum compared to each broadband visible light sensitive pixel.

2. The sensor device of claim 1, wherein the broadband visible light sensitive pixels are configured to have increased sensitivity to light in the 400 nm to 700 nm range, and the infrared light sensitive pixels are configured to have increased sensitivity to light in the 700 nm to 1000 nm range.

3. The sensor device of claim 1, wherein relative sensitivities to light of the light sensitive pixels includes a band gap in the 650 nm to 750 nm range, wherein both the broadband visible light sensitive pixels and the infrared light sensitive pixels are configured to have reduced sensitivity to light in the band gap range.

4. The sensor device of claim 1, further comprising a lens that includes an infrared bandpass filter configured to isolate ambient infrared light from the infrared light sensitive pixels.

5. The sensor device of claim 1, wherein the predetermined pattern of light sensitive pixels is a checkerboard pattern.

6. The sensor device of claim 1, wherein the predetermined pattern of light sensitive pixels alternates between columns of broadband visible light sensitive pixels and columns of infrared light sensitive pixels.

7. The sensor device of claim 1, wherein the predetermined pattern of light sensitive pixels alternates between rows of broadband visible light sensitive pixels and rows of infrared light sensitive pixels.

8. The sensor device of claim 1, wherein each broadband visible light sensitive pixel includes two or more differential visible light sensitive pixels, and each infrared light sensitive pixel includes two or more differential infrared light sensitive pixels.

9. The sensor device of claim 1, wherein the broadband visible light sensitive pixels are configured to output grayscale values.

10. The sensor device of claim 1, wherein the infrared light sensitive pixels are configured to be globally shuttered.

11. The sensor device of claim 1, wherein the infrared light sensitive pixels and the broadband visible light sensitive pixels are configured to be rolling shuttered.

12. The sensor device of claim 1, further configured to control a first shutter speed for the broadband visible light sensitive pixels independently of a second shutter speed for the infrared light sensitive pixels.

13. The sensor device of claim 1, further configured to concurrently expose the broadband visible light sensitive pixels and the infrared light sensitive pixels.

14. The sensor device of claim 1, wherein each light sensitive pixel is trenched such that each light sensitive pixel is optically isolated from each other light sensitive pixel of the array of light sensitive pixels.

15. A method comprising,
providing a sensor device including an array of light sensitive pixels arranged in a predetermined pattern of light sensitive pixels that alternates between broadband visible light sensitive pixels and infrared light sensitive pixels,
a color filter array of visible light filters and infrared light filters,
each broadband visible light sensitive pixel including a respective infrared light filter of the color filter array that causes that broadband visible light sensitive pixel to light of the visible light spectrum and to have reduced sensitivity to light of the infrared light spectrum compared to each infrared light sensitive pixel, and
each infrared light sensitive pixel including a respective visible light filter of the color filter array that causes that infrared light sensitive pixel to have increased sensitivity to light of the infrared light spectrum and to have reduced sensitivity to light of the visible light spectrum compared to each broadband visible light sensitive pixel;
at a processor, concurrently performing infrared sensing and tracking and simultaneous localization and mapping based on output of the sensor device.

16. A head mounted display device comprising,
a sensor device including an array of light sensitive pixels arranged in a predetermined pattern of light sensitive pixels that alternates between broadband visible light sensitive pixels and infrared light sensitive pixels, a color filter array of visible light filters and infrared light filters, each broadband visible light sensitive pixel including a respective infrared light filter of the color filter array that causes that broadband visible light sensitive pixel to have increased sensitivity to light of the visible light spectrum and to have reduced sensitivity to light of the infrared light spectrum compared to each infrared light sensitive pixel, and each infrared light sensitive pixel including a respective visible light filter of the color filter array that causes that infrared light sensitive pixel to have increased sensitivity to light of the infrared light spectrum and to have reduced sensitivity to light of the visible light spectrum compared to each broadband visible light sensitive pixel; and a processor configured to concurrently perform infrared sensing and tracking and simultaneous localization and mapping based on output of the sensor device.

17. The head mounted display device of claim 16, further comprising an active illuminator.

18. The head mounted display device of claim 16, wherein the sensor device is one of a plurality of sensor devices having the same configuration, and the plurality of sensor devices are located on the head mounted display device with overlapping field of views.

19. The head mounted display device of claim 16, wherein the sensor device is one of a plurality of sensor devices having the same configuration, and the plurality of sensor devices are located on the head mounted display device with non-overlapping field of views.

* * * * *